United States Patent
Ogino et al.

(10) Patent No.: US 7,692,494 B2
(45) Date of Patent: Apr. 6, 2010

(54) LOW STRAIN VARIABLE FREQUENCY AMPLIFIER

(75) Inventors: Tsuyoshi Ogino, Gunma (JP); Fumitaka Iizuka, Gunma (JP); Kunihiko Nakajima, Gunma (JP)

(73) Assignee: Taiyo Yuden Co., Ltd. (JP)

( * ) Notice: Subject to any disclaimer, the term of this patent is extended or adjusted under 35 U.S.C. 154(b) by 170 days.

(21) Appl. No.: 11/950,347

(22) Filed: Dec. 4, 2007

(65) Prior Publication Data

US 2008/0157876 A1 Jul. 3, 2008

(30) Foreign Application Priority Data

Dec. 6, 2006 (JP) .............. 2006-328950

(51) Int. Cl.
*H03F 3/04* (2006.01)
(52) U.S. Cl. ..................... 330/305; 455/107
(58) Field of Classification Search ............. 330/305; 455/107
See application file for complete search history.

(56) References Cited

U.S. PATENT DOCUMENTS

| | | | |
|---|---|---|---|
| 6,212,431 B1 * | 4/2001 | Hahn et al. ............... | 607/61 |
| 6,677,711 B2 * | 1/2004 | MacGearailt ............. | 315/111.21 |
| 6,946,847 B2 * | 9/2005 | Nishimori et al. ........ | 324/600 |
| 2007/0085609 A1 * | 4/2007 | Itkin et al. ............... | 330/302 |
| 2009/0051441 A1 * | 2/2009 | Branch et al. ............ | 330/305 |

FOREIGN PATENT DOCUMENTS

| | | |
|---|---|---|
| JP | 2000-114996 | 4/2000 |
| JP | 2005-079967 | 3/2005 |

* cited by examiner

*Primary Examiner*—Patricia Nguyen
(74) *Attorney, Agent, or Firm*—Chen Yoshimura LLP

(57) ABSTRACT

A variable frequency amplifier suffering less deterioration of strain characteristic and capable of operating at plural frequencies is disclosed. In one aspect, a changeable amplifier comprises an amplifying element, a changeable matching circuit disposed at an input side of the amplifying element and including a first variable capacity element connected in series with a signal conductor and a second variable capacity element connected in parallel with the signal conductor, and a control circuit for controlling the changeable matching circuit. Based on a feedback signal, the control circuit applies DC bias voltages to the first variable capacity element and the second variable capacity element of the changeable matching circuit and also applies thereto a correction signal.

11 Claims, 6 Drawing Sheets

[FIG. 1]
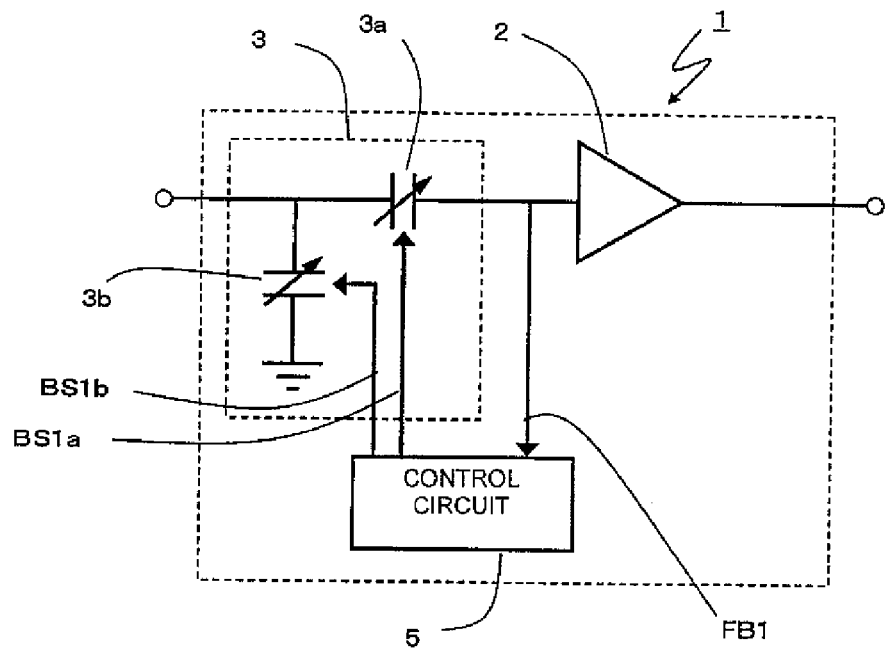
[FIGS. 2A to 2F]
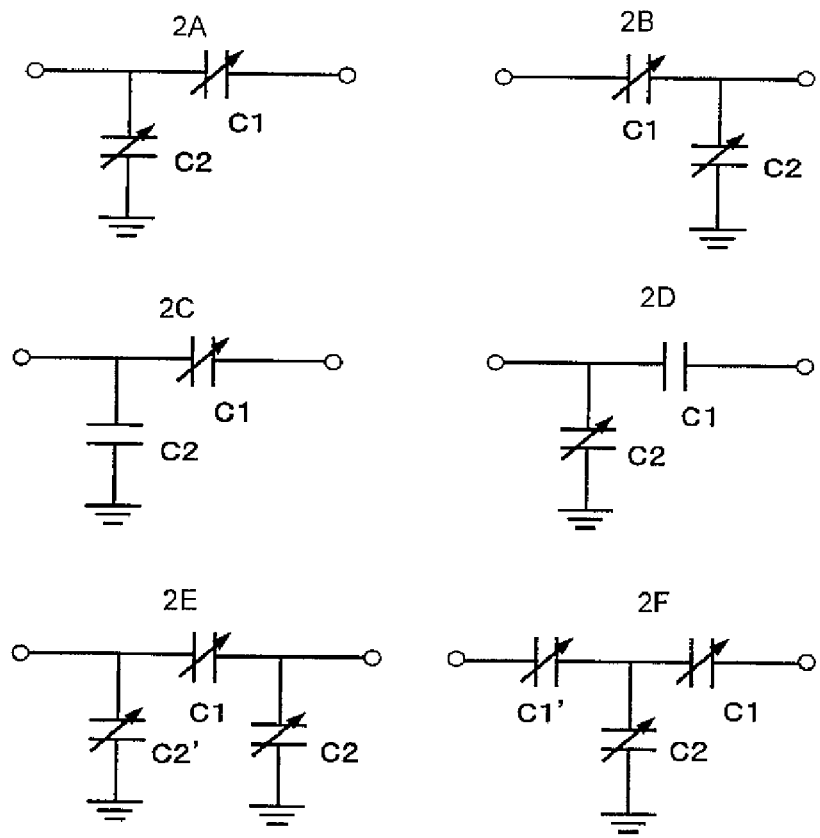

[FIG. 3]
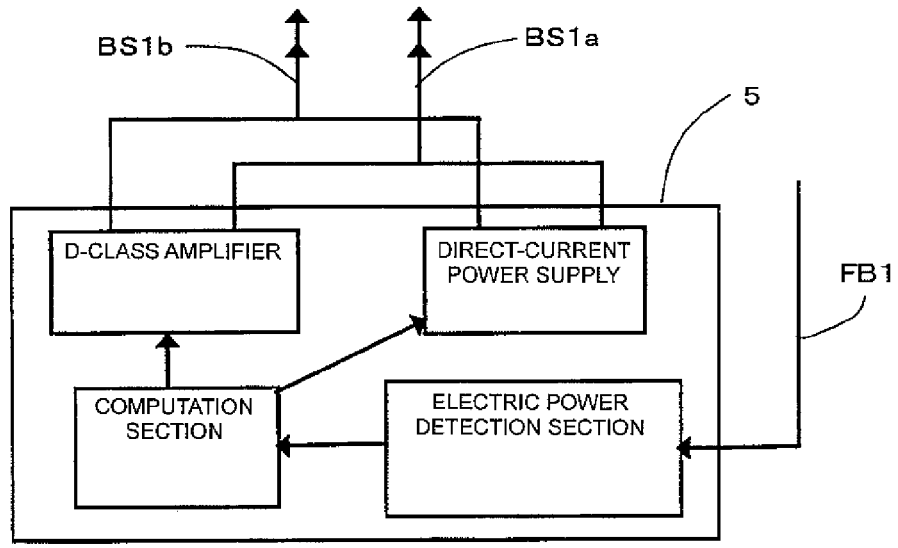
[FIGS. 4A to 4C]
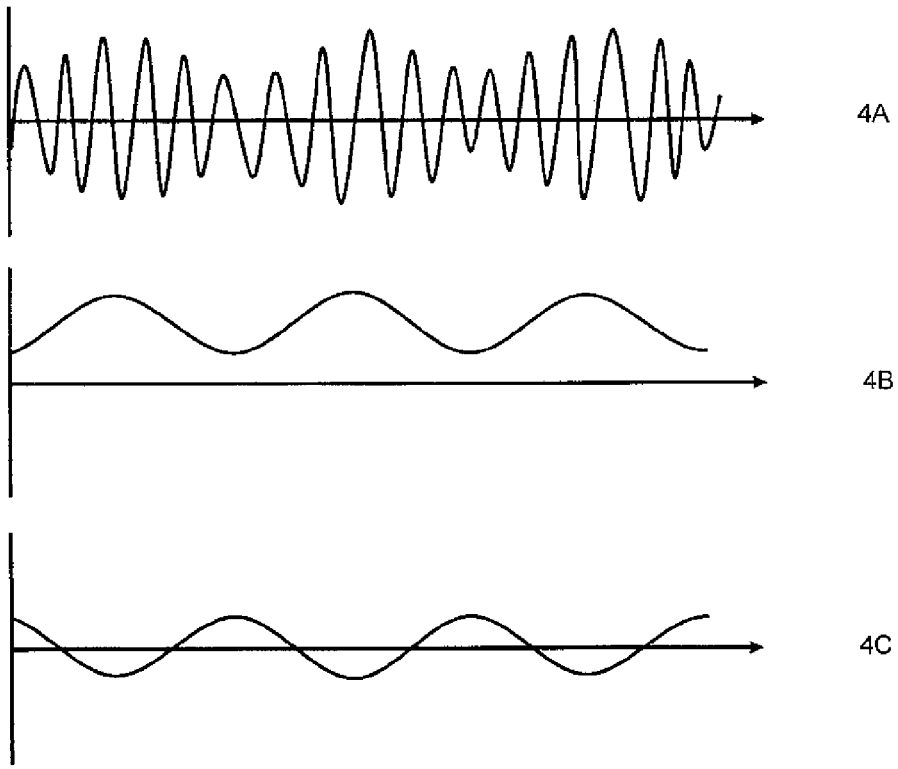

[FIG. 5]
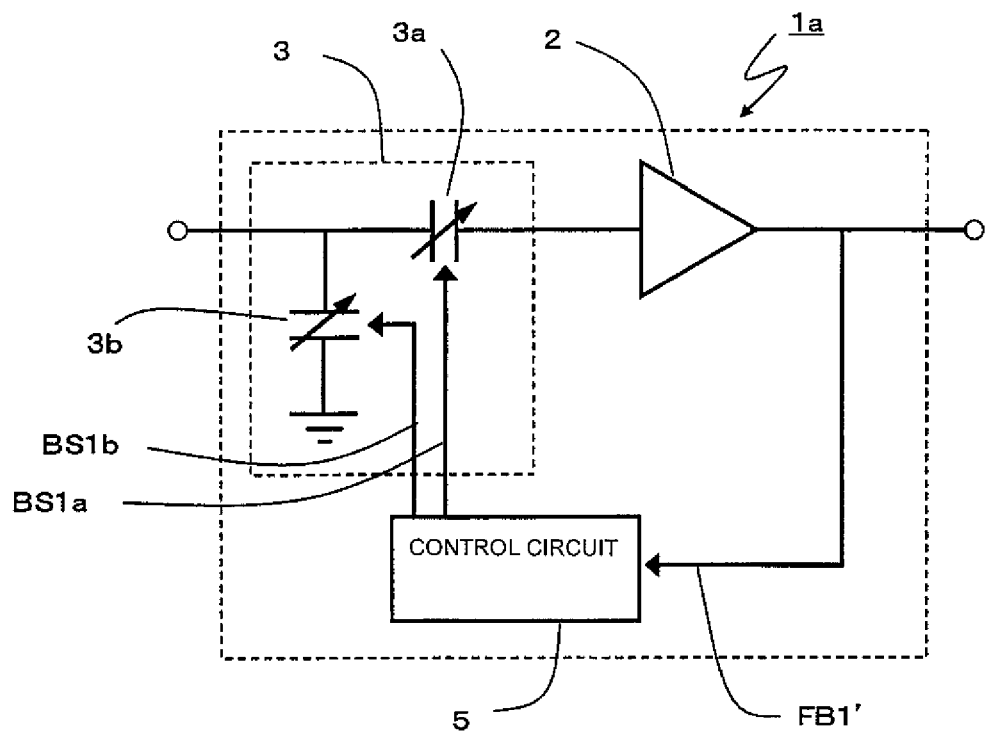
[FIG. 6]
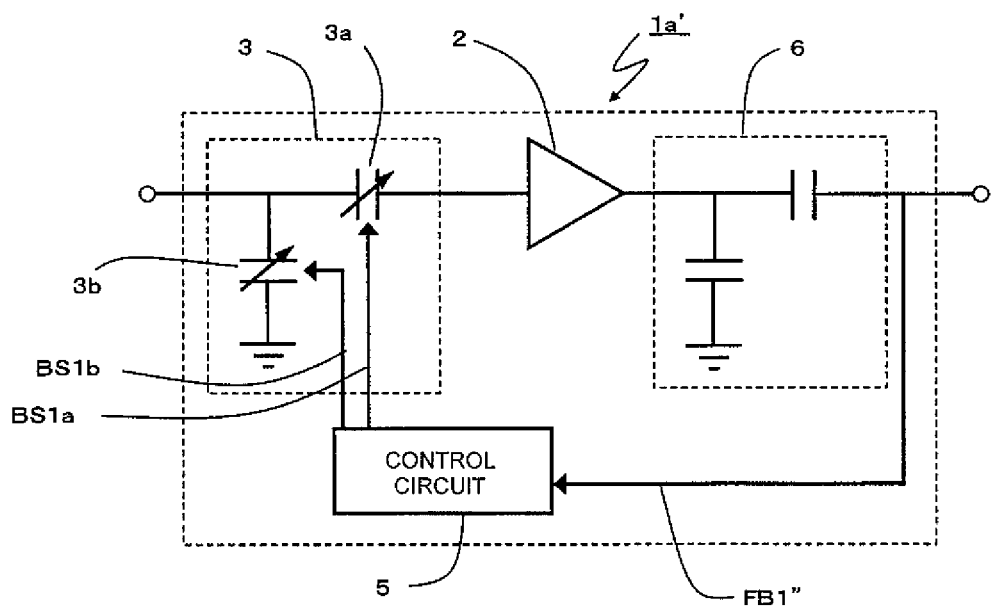

[FIG. 7]
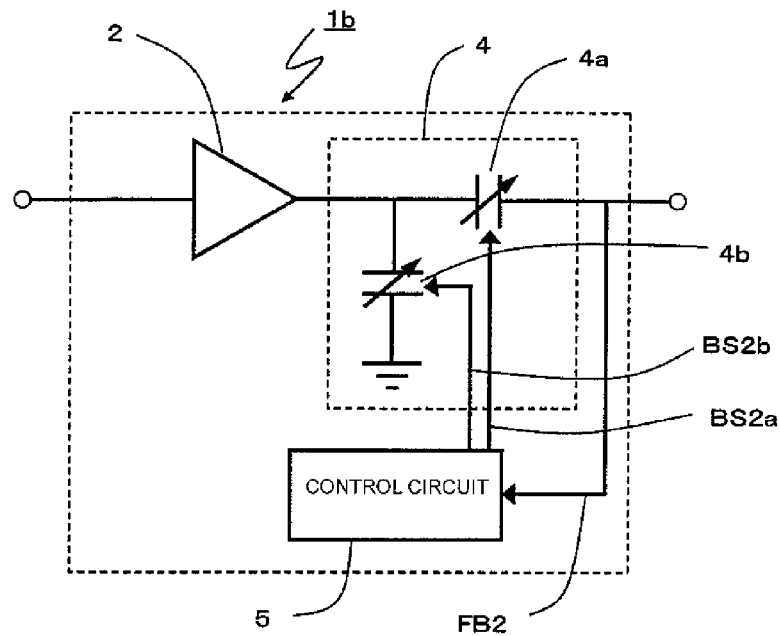
[FIG. 8]
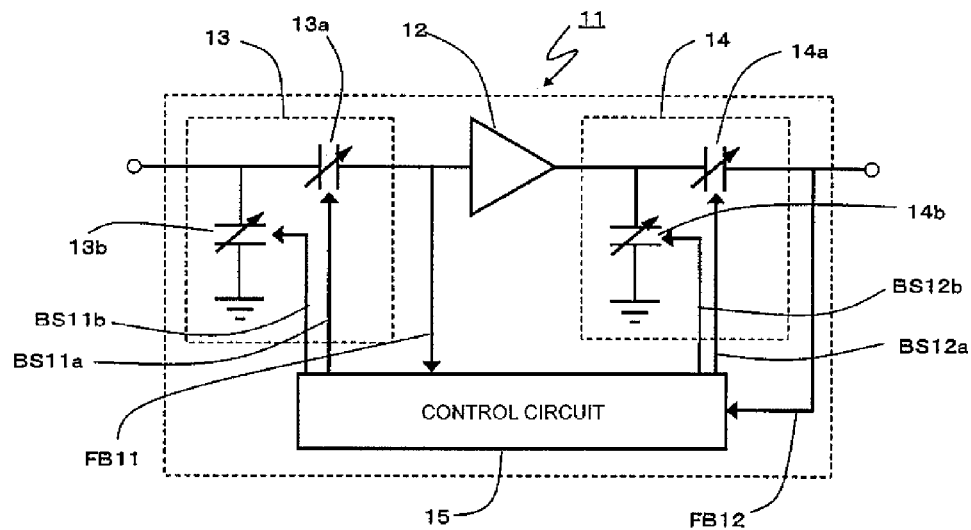

[FIG. 9]
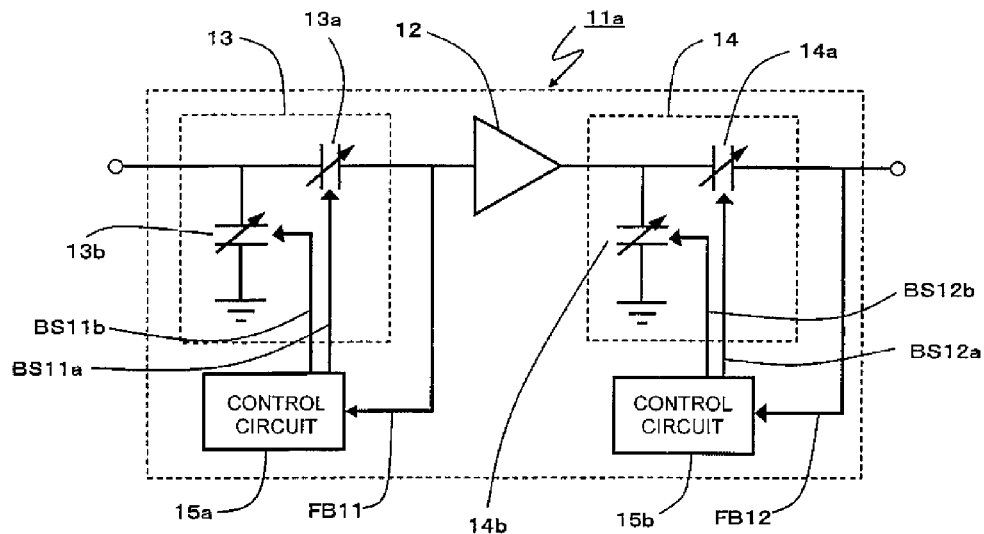
[FIG. 10]
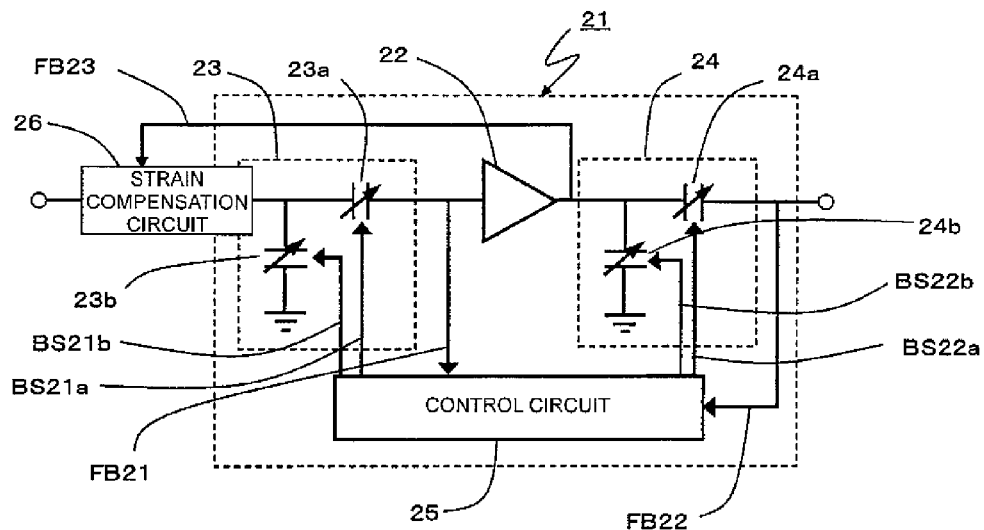

[FIG. 11]
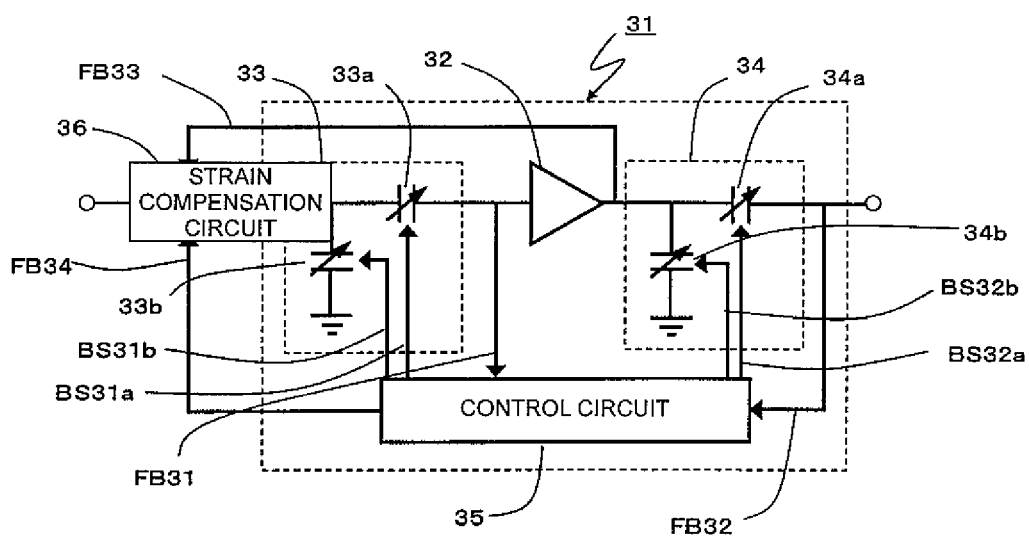

LOW STRAIN VARIABLE FREQUENCY AMPLIFIER

BACKGROUND OF THE INVENTION

1. Field of the Invention

The present invention relates to a variable frequency amplifier adapted to operate as tuned to each of operation frequencies of plural radio communication specifications and to reduce the strain of RF signals.

2. Description of the Related Technology

Radio equipment for use with radio communications systems typically exemplified by cellular phones, wireless LANs, Bluetooth and the like comprises an amplifier for amplifying received RF signals. The amplifier comprises: an amplifying element such as a field-effect transistor (FET); and a matching circuit at least disposed at an input side or an output side of the amplifying element. The matching circuit comprises: a capacitative element connected in series with a signal conductor; and a capacitative element connected in parallel with the signal conductor and with a ground. A power input side matching circuit is responsible for input impedance matching, whereas a power output side matching circuit is responsible for output impedance matching.

In the modern radio communications systems, so-called multiband or multimode radio communication equipment has been proposed which is adapted to switch between (among) plural radio communication specifications in order to overcome a problem associated with communication areas as well as to utilize the advantages of the individual specifications and to make up for shortcomings thereof. Such radio communication equipment adapted to the plural radio communication specifications comprises amplifiers corresponding to individual frequencies in order to tune to operation frequencies used in the individual radio communication specifications.

More recently, however, a demand for miniaturizing the radio communication equipment is increasing. As disclosed in JP-A-2005-079967 and JP-A-2000-114996, for example, an amplifier has been proposed wherein the capacitative element of the matching circuit is replaced by a variable capacity element, such as a variable capacitor or a varactor, so that the characteristics of the matching circuit may be conditioned according to the plural frequencies. The variable capacity element is varied in the electrostatic capacity thereof by applying thereto a bias voltage. This permits the dual-band or multimode radio communication equipment to employ a single amplifier so that the miniaturization of the radio communication equipment may be achieved.

In the current practice of radio communications, information is normally carried on signal amplitude. Namely, a normal RF signal is superimposed with a signal varied in amplitude, so that the RF signal is greatly varied in the amplitude. In a case where the matching circuit employs the variable capacity element the electrostatic capacity of which is varied by applying the bias voltage, the bias voltage is varied in association with the amplitudes of the RF signal. This causes the variations of electrostatic capacity, which result in strain.

The amplifier employing the variable capacity element, the electrostatic capacity of which is varied by applying the bias voltage, suffers greater deterioration of the strain characteristic as compared with a conventional amplifier employing a fixed capacitative element.

The invention is directed to a solution to such a problem, seeking to provide a variable frequency amplifier suffering less deterioration of the strain characteristic thereof and operable at plural frequencies.

SUMMARY OF CERTAIN INVENTIVE ASPECTS

In a first aspect of the invention, a variable frequency amplifier is provided which comprises: an amplifying element; and at least one changeable matching circuit disposed at either one of an input side and an output side of the amplifying element and including at least one variable capacity element having the electrostatic capacity thereof varied by applying a bias voltage thereto, the variable frequency amplifier further comprising a control circuit which applies the bias voltage to the variable capacity element of the changeable matching circuit for controlling the capacitance value thereof and which detects an output signal from the changeable matching circuit or the amplifying element for applying a correction signal to the variable capacity element of the changeable matching circuit.

According to the first aspect of the invention, the deterioration of strain characteristic may be reduced by reducing the variations of electrostatic capacity of the variable capacity element of the power input side changeable matching circuit or the power output side changeable matching circuit, the electrostatic capacity variations caused by the RF signal.

In a second aspect according to the first aspect of the invention, a variable frequency amplifier is provided wherein the changeable matching circuit is disposed at the input side of the amplifying element, and the control circuit detects the output signal from the changeable matching circuit for applying the correction signal to the variable capacity element of the changeable matching circuit. According to the second aspect of the invention, the output signal from the power input side changeable matching circuit may be reduced in the deterioration of strain characteristic.

In a third aspect according to the first aspect of the invention, a variable frequency amplifier is provided wherein the changeable matching circuit is disposed at the input side of the amplifying element, and the control circuit detects the output signal from the amplifying element for applying the correction signal to the variable capacity element of the changeable matching circuit. According to the third aspect of the invention, the output signal from the power input side changeable matching circuit and the output signal from the amplifying element may be reduced in the deterioration of strain characteristic.

In a fourth aspect according to the first aspect of the invention, a variable frequency amplifier is provided wherein the changeable matching circuit is disposed at the output side of the amplifying element, and the control circuit detects the output signal from the changeable matching circuit for applying the correction signal to the variable capacity element of the changeable matching circuit. According to the fourth aspect of the invention, the overall output signal from the power output side changeable matching circuit, or the overall output signal from the amplifier may be reduced in the deterioration of strain characteristic.

In a fifth aspect according to the first aspect of the invention, a variable frequency amplifier is provided wherein the changeable matching circuits are disposed at both the input side and the output side of the amplifying element, and the control circuit detects the output signal from at least either one of the power input side changeable matching circuit and the power output side changeable matching circuit for applying the correction signal to the variable capacity element of at least either one of the power input side changeable matching circuit and the power output side changeable matching circuit. According to the fifth aspect, a more fine strain correction may be provided in a wider frequency band. In addition, the control circuit is divided into a first control circuit for controlling the power input side changeable matching circuit and a second control circuit for controlling the power output side changeable matching circuit. This permits the power input side changeable matching circuit and the power output side changeable matching circuit to be controlled independently, so that an even more fine strain correction may be accomplished.

In a sixth aspect according to any one of the first to fifth aspects of the invention, a variable frequency amplifier is provided wherein a strain compensation circuit operative to detect the output signal from the amplifying element and to perform strain correction is disposed at the input side of the amplifying element. According to the sixth aspect, the strain caused by the amplifying element may be corrected so that the signal varying the electrostatic capacity of the variable capacity element of the matching circuit may be reduced. In addition, the strain compensation circuit performs the strain correction based on a control signal from the control circuit, thereby negating the need for superimposing the correction signal on the bias voltage applied to the variable capacity element of the matching circuit. This obviates the need for providing a circuit for generating the correction signal to be applied to the variable capacity element and hence, the miniaturization of the circuit may be achieved.

According to these inventive aspects, the changeable amplifier suffering less deterioration of strain characteristic and operable at plural frequencies may be provided.

BRIEF DESCRIPTION OF THE DRAWINGS

FIG. 1 is a conceptual diagram showing a variable frequency amplifier according to a first embodiment of the invention;

FIG. 2A to FIG. 2F are a group of diagrams showing the variations of a matching circuit;

FIG. 3 is a conceptual diagram showing a configuration of a control circuit disposed in the variable frequency amplifier of one embodiment;

FIG. 4A shows a waveform of an RF signal inputted to the amplifier, FIG. 4B showing a waveform of a signal varied in amplitude, FIG. 4C showing a waveform of a correction signal applied to a variable capacity element;

FIG. 5 is a conceptual diagram showing a variable frequency amplifier according to a second embodiment of the invention;

FIG. 6 is a conceptual diagram showing a modification of the variable frequency amplifier according to the second embodiment of the invention;

FIG. 7 is a conceptual diagram showing a variable frequency amplifier according to a third embodiment of the invention;

FIG. 8 is a conceptual diagram showing a variable frequency amplifier according to a fourth embodiment of the invention;

FIG. 9 is a conceptual diagram showing a modification of the variable frequency amplifier according to the fourth embodiment of the invention;

FIG. 10 is a conceptual diagram showing a variable frequency amplifier according to a fifth embodiment of the invention; and FIG. 11 is a conceptual diagram showing a variable frequency amplifier according to a sixth embodiment of the invention.

DETAILED DESCRIPTION OF CERTAIN EMBODIMENTS

A changeable amplifier according to a first embodiment of the invention is described with reference to FIG. 1 to FIGS. 4A to 4C. FIG. 1 is a conceptual diagram showing the changeable amplifier according to certain embodiments. It is noted that the following conceptual diagrams omit elements such as an inductor and resistor other than those essential for the explanation of the embodiments.

A changeable amplifier 1 comprises: an amplifying element 2 such as an FET; a changeable matching circuit 3 disposed at an input side of the amplifying element 2; and a control circuit 5 for controlling the changeable matching circuit 3. The changeable matching circuit 3 comprises: a first capacitative element $3a$ connected in series with a signal conductor; and a second capacitative element $3b$ connected in parallel with the signal conductor and also connected with a ground. Either of the first capacitative element $3a$ and the second capacitative element $3b$ comprises a variable capacity element having the electrostatic capacity thereof varied by applying thereto a DC bias voltage. Examples of the variable capacity element includes: a variable capacitor having the permittivity thereof varied by an electric field generated by applying the DC bias voltage; a varactor having the electrostatic capacity thereof varied by applying a reverse bias using the DC bias voltage; and the like.

As shown in FIG. 2, the changeable matching circuit has a variety of modes such that the amplifier may change the matching circuit according to a band width of an operation frequency region, control accuracies or the like. As illustrated by FIG. 2A, a configuration may be made such that a capacitative element C2 connected in parallel with the signal conductor and connected with the ground may be disposed at the input side of a capacitative element C1 connected in series with the signal conductor (provided that the input side is defined as the left-hand side as seen in the figure). As illustrated by FIG. 2B, the capacitative element C2 may be disposed at an output side of the capacitative element C1 (provided that the input side is defined as the left-hand side as seen in the figure). Alternatively, as illustrated by FIG. 2C and FIG. 2D, either one of the capacitative elements C1, C2 may comprise a variable capacity element. Otherwise, as illustrated by FIG. 2E and FIG. 2F, another capacitative element C1', C2' may be added so that the matching circuit comprises three or more capacitative elements. In this case, the matching circuit may be a π-type circuit as illustrated by FIG. 2E, a T-type circuit as illustrated by FIG. 2F or the like. Needless to say, at least any one of the capacitative elements C1, C2, C1', C2' may comprise the variable capacity element. The embodiment of the invention is described with reference to the changeable amplifier employing the changeable matching circuit shown in FIG. 2A.

As shown in FIG. 3, the control circuit 5 comprises: a direct-current power supply for applying bias voltages $BS1a$, $BS1b$ to the variable capacity element of the changeable matching circuit 3; an electric power detection section for detecting a feedback signal FB1; a D-class amplifier for generating a correction signal to be applied to the variable capacity element; and an computation section for controlling the direct-current power supply, the electric power detection section and the D-class amplifier. The control circuit 5 operates as follows. First, the computation section calculates an impedance value matched with the operation frequency of the changeable amplifier 1, while a control signal is sent to the direct-current power supply. Based on the instruction signal so sent, the direct-current power supply applies the bias voltages BS1*a*, BS1*b* to the variable capacity elements of the changeable matching circuit 3 for adjusting the electrostatic capacities of the elements. Next, an output signal from the changeable matching circuit 3 is inputted as the feedback signal FB1 to the electric power detection section, which detects an electric power of the output signal and an output impedance. Based on the detected electric power and output impedance as well as the previously calculated impedance value, the computation section calculates an amplitude and phase of signal variations at the variable capacity elements. Based on the calculation results, the computation section calculates an amplitude and phase of a signal canceling the signal variations, while a control signal based on the calculation results is sent to the D-class amplifier. Based on the control signal so sent, the D-class amplifier outputs the correction signal, which is applied to the variable capacity elements of the changeable matching circuit 3 as superimposed on the respective bias voltages BS1*a*, BS1*b*.

An operation of such a changeable amplifier 1 is described. The description is made on assumption that both the first capacitative element 3*a* and the second capacitative element 3*b* of the changeable matching circuit 3 are variable capacity elements. First, the control circuit 5 applies the DC bias voltages BS1*a*, BS1*b* to the first capacitative element 3*a* and the second capacitative element 3*b* of the changeable matching circuit 3, respectively, so that the electrostatic capacities of the elements are decided. This permits the changeable amplifier 1 to operate in a desired frequency band and to obtain a desired gain.

Next, an RF signal as illustrated by FIG. 4A is inputted to the changeable amplifier 1. The RF signal shown in FIG. 4A comprises a signal of a desired frequency, which is superimposed with a signal varied in amplitude as shown in FIG. 4B. The signal of FIG. 4B varies the bias voltage applied to the variable capacity element, so that the capacitance value of the variable capacity element is varied, causing strain in an output signal from the variable capacity element.

Next, the control circuit 5 detects the output signal from the changeable matching circuit 3 via the feedback signal FB1. Thus, the control circuit 5 detects the strain caused by the signal of FIG. 4B. Based on the detected strain, the control circuit 5 applies a correction signal, as shown in FIG. 4C, to the first capacitative element 3*a* and the second capacitative element 3*b* of the changeable matching circuit 3 via the lines of the DC bias voltages BS1*a* and BS1*b*, the correction signal having the opposite phase to that of the signal of FIG. 4B.

Thus, the signal of FIG. 4B is cancelled by the correction signal of FIG. 4C so that the individual capacitative elements may be reduced in the variations of electrostatic capacities. Hence, the RF signal outputted from the changeable matching circuit 3 may be reduced in strain. It is noted here that the correction signal may comprise a continuous wave or a step wave. This embodiment may also be arranged such that a fixed matching circuit comprising a fixed capacitative element is disposed at the output side of the amplifying element 2.

Next, a changeable amplifier according to a second embodiment of the invention is described with reference to FIG. 5 and FIG. 6. A difference between a changeable amplifier 1*a* shown in FIG. 5 and the changeable amplifier 1 of the first embodiment shown in FIG. 1 is as follows. In the changeable amplifier 1 of the first embodiment, the control circuit 5 detects the output signal from the changeable matching circuit 3. In the changeable amplifier 1*a* of this embodiment, on the other hand, the control circuit 5 detects an output signal from the amplifying element 2.

The changeable amplifier 1*a* operates as follows. First, the control circuit 5 applies the respective DC bias voltages BS1*a*, BS1*b* to the first capacitative element 3*a* and the second capacitative element 3*b* of the changeable matching circuit 3 for deciding the respective electrostatic capacities thereof, thereby permitting the changeable amplifier 1*a* to operate in the desired frequency band and to obtain the desired gain.

Subsequently, the RF signal is inputted to the changeable matching circuit 3 and the amplifying element 2 and then, the amplifying element 2 outputs the signal. At this time, the control circuit 5 detects the output signal from the amplifying element 2 via a feedback signal FB1'. Based on the feedback signal FB1', the control circuit 5 applies an optimum correction signal to the first capacitative element 3*a* and the second capacitative element 3*b* of the changeable matching circuit 3 via the lines of the DC bias voltages BS1*a* and BS1*b*.

Since the changeable matching circuit 3 is controlled based on the output signal from the amplifying element 2 in this manner, the strain including the strain caused by the amplifying element 2 may be reduced. Similarly to the first embodiment, this embodiment may also be arranged such that the fixed matching circuit comprising the fixed capacitative element is disposed at the output side of the amplifying element 2. It is noted that the control circuit operates in the same manner as that of FIG. 5 in a case where the control circuit 5 detects the signal on an input side of the fixed matching circuit. However, in a case where the control circuit 5 detects the signal on an output side of the fixed matching circuit, the control circuit 5 detects an output signal from a fixed matching circuit 6 via a feedback signal FB1", as shown in FIG. 6. Such a changeable amplifier 1*a'* is capable of reducing the strain including that of a signal matched by the fixed matching circuit 6.

Next, a changeable amplifier according to a third embodiment of the invention is described with reference to FIG. 7. A difference between a changeable amplifier 1*b* shown in FIG. 7 and the changeable amplifier 1 of the first embodiment shown in FIG. 1 is as follows. The changeable amplifier 1 of the first embodiment has the arrangement wherein the changeable matching circuit 3 is disposed at the input side of the amplifying element 2, whereas the changeable amplifier 1*b* of this embodiment is arranged such that a changeable matching circuit 4 is disposed at the output side of the amplifying element 2.

This changeable amplifier 1*b* operates as follows. First, the control circuit 5 applies respective DC bias voltages BS2*a*, BS2*b* to a first capacitative element 4*a* and a second capacitative element 4*b* of the changeable matching circuit 4 for deciding the respective electrostatic capacities thereof thereby permitting the changeable amplifier 1*b* to operate in the desired frequency band and to obtain the desired gain.

Subsequently, the RF signal is inputted to the amplifying element 2 and the changeable matching circuit 4 and then, the changeable matching circuit 4 outputs the signal. At this time, the control circuit 5 detects the output signal from the changeable matching circuit 4 via a feedback signal FB2. Based on the feedback signal FB2, the control circuit 5 applies an optimum correction signal to the first capacitative element 4*a* and the second capacitative element 4*b* of the changeable matching circuit 4 via the lines of the DC bias voltages BS2*a* and BS2*b*.

Since the changeable matching circuit 4 is controlled based on the output signal from the changeable matching circuit 4 in this manner, the strain in the overall output signal from the changeable amplifier 1b may be reduced. This embodiment may also be arranged such that the fixed matching circuit comprising the fixed capacitative element is disposed at the input side of the amplifying element 2.

Next, a changeable amplifier according to a fourth embodiment of the invention is described with reference to FIG. 8. A difference between a changeable amplifier 11 shown in FIG. 8 and the changeable amplifier 1 of the first embodiment shown in FIG. 1 is as follows. The changeable amplifier 1 of the first embodiment has the arrangement wherein the changeable matching circuit 3 is disposed at the input side of the amplifying element 2, whereas the changeable amplifier 11 of this embodiment is arranged such that a changeable matching circuit 13 is disposed at the input side of the amplifying element 2 and a changeable matching circuit 14 is disposed at the output side of the amplifying element 2, and that both the power input side changeable matching circuit 13 and the power output side changeable matching circuit 14 are controlled by a control circuit 15.

The changeable amplifier 11 operates as follows. First, the control circuit 15 applies respective DC bias voltages BS11a, BS11b to a first capacitative element 13a and a second capacitative element 13b of the changeable matching circuit 13 and respective DC bias voltages BS12a, BS12b to a first capacitative element 14a and a second capacitative element 14b of the changeable matching circuit 14 for deciding the respective electrostatic capacities thereof, thereby permitting the changeable amplifier 11 to operate in the desired frequency band and to obtain the desired gain.

Subsequently, the RF signal is inputted to the changeable matching circuit 13, the amplifying element 2 and the changeable matching circuit 14. The changeable matching circuit 14 outputs a signal. At this time, the control circuit 15 detects an output signal from the power input side changeable matching circuit 13 via a feedback signal FB11 and detects an output signal from the power output side changeable matching circuit 14 via a feedback signal FB12. This changeable amplifier 11 is designed to operate in various patterns according to the combinations of the feedback signal and different modes of outputting the correction signal to the changeable matching circuit.

Operation Pattern 1

The control circuit 15 first detects the output signal from the power input side changeable matching circuit 13 via the feedback signal FB11. Based on the detection result, the control circuit applies the optimum correction signal to the first capacitative element 13a and the second capacitative element 13b of the changeable matching circuit 13 via the lines of the DC bias voltages BS11a and BS11b. On the other hand, the control circuit detects the output signal from the power output side changeable matching circuit 14 via the feedback signal FB12. Based on the detection result, the control circuit applies the optimum correction signal to the first capacitative element 14a and the second capacitative element 14b of the changeable matching circuit 14 via the lines of the DC bias voltages BS12a and BS12b. This operation pattern is adapted to reduce the strain in the signal inputted to the amplifying element 2 and also to reduce the strain in the overall signal in the changeable amplifier 11. Furthermore, a fine impedance matching may be accomplished because the changeable matching circuits are disposed on both the input side and the output side.

Operation Pattern 2

The control circuit 15 first detects the output signal from the power output side changeable matching circuit 14 via the feedback signal FB12. Based on the detection result, the control circuit applies the optimum correction signal to the first capacitative element 13a and the second capacitative element 13b of the changeable matching circuit 13 via the lines of the DC bias voltages BS11a and BS11b. The control circuit also applies the optimum correction signal to the first capacitative element 14a and the second capacitative element 14b of the changeable matching circuit 14 via the lines of the DC bias voltages BS12a and BS12b. This operation pattern is a mode wherein the changeable amplifier 1b illustrated by the third embodiment is further provided with the power input side changeable matching circuit 13. Hence, the operation pattern is adapted to reduce the strain in the overall output signal from the changeable amplifier 1b and also to provide the fine impedance matching.

Operation Pattern 3

The control circuit 15 first detects the output signal from the power input side changeable matching circuit 13 via the feedback signal FB11. Based on the detection result, the control circuit applies the optimum correction signal to the first capacitative element 13a and the second capacitative element 13b of the power input side changeable matching circuit 13 via the lines of the DC bias voltages BS11a and BS11b. On the other hand, the control circuit does not apply the correction signal to the first capacitative element 14a and the second capacitative element 14b of the power output side changeable matching circuit 14, merely applying the DC bias voltages BS12a and BS12b. This operation pattern is equivalent to the arrangement of the first embodiment, providing the same effect as that of the first embodiment.

Operation Pattern 4

The control circuit 15 first detects the output signal from the power output side changeable matching circuit 14 via the feedback signal FB12. Based on the detection result, the control circuit applies the optimum correction signal to the first capacitative element 14a and the second capacitative element 14b of the power output side changeable matching circuit 14 via the lines of the DC bias voltages BS12a and BS12b. On the other hand, the control circuit does not apply the correction signal to the first capacitative element 13a and the second capacitative element 13b of the power input side changeable matching circuit 13, merely applying the DC bias voltages BS11a and BS11b. This operation pattern is equivalent to the arrangement of the third embodiment, providing the same effect as that of the third embodiment.

The embodiment may be carried out by properly selecting any one of the above operation patterns 1 to 4 according to the operation frequency and the like. A modification of the embodiment may be exemplified by a changeable amplifier 11a shown in FIG. 9. In this changeable amplifier 11a, the control circuit is divided into a control circuit 15a for controlling the power input side changeable matching circuit 13 and a control circuit 15b for controlling the power output side changeable matching circuit 14. This arrangement is adapted to provide an optimum control to the respective changeable matching circuits because the individual changeable matching circuits have their own control circuits. The arrangement permits the selection of any one of the operation patterns 1 to 4 except for the operation pattern 2.

Next, a changeable amplifier according to a fifth embodiment of the invention is described with reference to FIG. 10. A changeable amplifier 21 shown in FIG. 10 differs from the changeable amplifier 11 of the fourth embodiment shown in FIG. 8 in that a strain compensation circuit 26 is provided at an input side of the changeable amplifier 21. This strain compensation circuit 26 is employed for performing a so-called pre-distortion wherein a distortion equivalent to the strain caused by the amplifying element 22 is previously superimposed on the signal for the purpose of reducing the strain caused by the amplifying element 22.

This changeable amplifier 21 operates as follows. First, a control circuit 25 applies respective DC bias voltages BS21a, BS21b to a first capacitative element 23a and a second capacitative element 23b of a power input side changeable matching circuit 23, and also applies respective DC bias voltages BS22a, BS22b to a first capacitative element 24a and a second capacitative element 24b of a power output side changeable matching circuit 24, so as to decide the electrostatic capacities of the capacitative elements. Thus, the changeable amplifier 21 is permitted to operate in the desired frequency band and to obtain the desired gain.

Subsequently, the RF signal is inputted to the changeable amplifier 21. The RF signal is previously distorted by means of the strain compensation circuit 26 based on a feedback signal FB23 outputted from an amplifying element 22. Hence, the power input side changeable matching circuit 23 is supplied with the distorted signal, whereas the power output side changeable matching circuit 24 is supplied with the output signal from the amplifying element 22. At this time, the control circuit 25 detects an output signal from the power input side changeable matching circuit 23 via a feedback signal FB21, and detects an output signal from the power output side changeable matching circuit 24 via a feedback signal FB22. Based on the feedback signal FB21, the control circuit 25 applies a correction signal corresponding to the pre-distorted signal to the first capacitative element 23a and the second capacitative element 23b of the power input side changeable matching circuit 23 via the lines of the DC bias voltages BS21a, BS21b. Based on the feedback signal FB22, on the other hand, the control circuit applies a correction signal corresponding to the output signal from the amplifying element 22 to the first capacitative element 24a and the second capacitative element 24b of the power output side changeable matching circuit 24 via the lines of the DC bias voltages BS22a, BS22b.

A low strain changeable amplifier may be realized by performing the strain correction on the pre-distorted signal by means of the strain compensation circuit 26.

Next, a changeable amplifier according to a sixth embodiment of the invention is described with reference to FIG. 11. A changeable amplifier 31 shown in FIG. 11 differs from the changeable amplifier 21 of the fifth embodiment shown in FIG. 10 in that a control circuit 35 controls a strain compensation circuit 36 by way of a feedback signal FB34.

Such a changeable amplifier 31 operates as follows. First, the control circuit 35 sends a feedback signal FB34 to the strain compensation circuit 36 based on a feedback signal FB31 as an output signal from a power input side changeable matching circuit 33 and a feedback signal FB32 as an output signal from a power output side changeable matching circuit 34. The strain compensation circuit 36 subjects the RF signal to pre-distortion based on a feedback signal FB33 as an output signal from an amplifying element 32 and the feedback signal FB34 from the control circuit 35 and then, sends the resultant RF signal to the changeable amplifier 31.

The pre-distorted RF signal negates the need for applying the correction signal to the individual capacitative elements of the matching circuits because the RF signal is previously superimposed with the strain corresponding to the strain produced in each of the power input side changeable matching circuit 33, the amplifying element 32 and the power output side changeable matching circuit 34. Hence, it in only needed to apply the DC bias voltages to these capacitative elements for deciding the electrostatic capacities thereof. This obviates the need for providing the circuit for generating the correction signal to be supplied to the capacitative elements, so that the changeable amplifier may be further miniaturized.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A variable frequency amplifier comprising: an amplifying element; and at least one changeable matching circuit disposed at either one of an input side and an output side of the amplifying element and including at least one variable capacity element having the electrostatic capacity thereof variable by applying a bias voltage thereto,
    further comprising a control circuit configured to apply the bias voltage to the variable capacity element for controlling the capacitance value thereof and to detect an output signal from the changeable matching circuit or the amplifying element and apply a correction signal to the variable capacity element based on the output signal,
    wherein the changeable matching circuit is disposed at the input side of the amplifying element, and the control circuit detects the output signal from the changeable matching circuit for applying the correction signal to the variable capacity element.

2. A variable frequency amplifier comprising:
    an amplifying element;
    at least two changeable matching circuits disposed at the input side and the output side of the amplifying element respectively, each changeable matching circuit including at least one variable capacity element having the electrostatic capacity thereof variable by applying a bias voltage thereto; and
    a control circuit configured to apply the bias voltage to the variable capacity element for controlling the capacitance value thereof and to detect an output signal from the changeable matching circuit or the amplifying element and apply a correction signal to the variable capacity element based on the output signal, and the control circuit detects the output signal from at least either one of the changeable matching circuits for applying the correction signal to the variable capacity element of at least one of the changeable matching circuits.

3. The variable frequency amplifier according to claim 2, wherein the control circuit comprises a first control circuit configured to control the power input side changeable matching circuit and a second control circuit configured to control the power output side changeable matching circuit.

4. A variable frequency amplifier comprising:
    an amplifying element;

at least one changeable matching circuit disposed at either one of an input side and an output side of the amplifying element and including at least one variable capacity element having the electrostatic capacity thereof variable by applying a bias voltage thereto;

a control circuit configured to apply the bias voltage to the variable capacity element for controlling the capacitance value thereof and to detect an output signal from the changeable matching circuit or the amplifying element and apply a correction signal to the variable capacity element based on the output signal; and a strain compensation circuit disposed at the input side of the amplifying element and configured to detect the output signal from the amplifying element and to perform strain correction.

5. The variable frequency amplifier according to claim 4, wherein the strain compensation circuit performs the strain correction based on a control signal from the control circuit.

6. A variable frequency amplifier comprising:

a changeable matching circuit disposed at an input side or output side of an amplifying element, the matching circuit comprising at least one variable capacity element having a capacitance variable by varying a bias voltage applied thereto;

a control circuit configured to control the capacitance of the variable capacity element, the control circuit comprising a feedback loop from an output of the changeable matching circuit or the amplifying element; and a strain compensation circuit disposed at an input of the variable frequency amplifier and configured to apply a strain correction signal to a signal at the input of the variable frequency amplifier, based on an output signal from the amplifier element.

7. The variable frequency amplifier according to claim 6, wherein the control circuit is further configured to control the capacitance of the variable capacity element to tune the amplifier to one of a plurality of working frequencies.

8. A method of operating a variable frequency amplifier, the amplifier comprising a changeable matching circuit disposed at an input side of an amplifying element, the matching circuit comprising at least one variable capacity element, the method comprising varying the bias voltage applied to the variable capacity element based at least in part on an output signal from the changeable matching circuit.

9. A method of operating a variable frequency amplifier, the amplifier comprising at least two changeable matching circuits disposed at an input side and an output side of an amplifying element respectively, each changeable matching circuit comprising at least one variable capacity element, the method comprising varying the bias voltage applied to the variable capacity element of at least one of the changeable matching circuits based at least in part on an output signal from at least one of the changeable matching circuits.

10. A method of operating a variable frequency amplifier, the amplifier comprising a changeable matching circuit disposed at an input side or an output side of an amplifying element and a strain compensation circuit disposed at the input side of the amplifying element, the matching circuit comprising at least one variable capacity element, the method comprising:

varying the bias voltage applied to the variable capacity element based at least in part on an output signal from the changeable matching circuit or the amplifying element; and performing strain correction based at least in part on an output signal from the amplifying element.

11. A method of operating a variable frequency amplifier, the amplifier comprising a changeable matching circuit disposed at an input side or an output side of an amplifying element, the matching circuit comprising at least one variable capacity element having a capacitance variable by varying a bias voltage applied thereto, the amplifier further comprising a strain compensation circuit disposed at an input of the variable frequency amplifier, the method comprising:

varying the bias voltage applied to the variable capacity element based at least in part on an output signal from the changeable matching circuit or the amplifying element; and applying a correction signal to a signal at the input of the variable frequency amplifier based at least in part on an output signal from the amplifying element.

* * * * *